United States Patent
Nickel et al.

(10) Patent No.: US 8,253,420 B2
(45) Date of Patent: Aug. 28, 2012

(54) INTEGRATED ELECTRICAL CIRCUIT AND TEST TO DETERMINE THE INTEGRITY OF A SILICON DIE

(75) Inventors: Charles Nickel, Williamsburg, MA (US); Katherine Nickel, legal representative, Williamsburg, MA (US); David Lidsky, Oakland, CA (US); Seth Kahn, San Francisco, CA (US)

(73) Assignee: Volterra Semiconductor Corporation, Fremont, CA (US)

( * ) Notice: Subject to any disclaimer, the term of this patent is extended or adjusted under 35 U.S.C. 154(b) by 348 days.

(21) Appl. No.: 12/631,221

(22) Filed: Dec. 4, 2009

(65) Prior Publication Data

US 2011/0133747 A1    Jun. 9, 2011

(51) Int. Cl.
*G01R 31/08* (2006.01)

(52) U.S. Cl. ........ 324/522; 324/527; 324/525; 324/528; 324/757.04; 324/757.03; 324/762.02; 324/762.03; 324/762.05

(58) Field of Classification Search ............ 324/522, 324/527, 525, 528, 757.04, 757.03, 762.02, 324/762.03, 762.05
See application file for complete search history.

(56) References Cited

U.S. PATENT DOCUMENTS

| | | | | |
|---|---|---|---|---|
| 4,356,379 A * | 10/1982 | Graeme | ............ | 219/209 |
| 4,851,782 A * | 7/1989 | Jeerings et al. | ............ | 324/520 |
| 4,871,971 A * | 10/1989 | Jeerings et al. | ............ | 324/509 |
| 5,559,427 A * | 9/1996 | Hinds et al. | ............ | 324/66 |
| 5,657,332 A * | 8/1997 | Auclair et al. | ............ | 714/763 |
| 5,672,966 A * | 9/1997 | Palczewski et al. | ............ | 324/762.02 |
| 5,753,391 A * | 5/1998 | Stone et al. | ............ | 430/22 |
| 6,271,675 B1 * | 8/2001 | Sakaki | ............ | 324/762.02 |
| 6,278,264 B1 * | 8/2001 | Burstein et al. | ............ | 323/282 |
| 6,429,675 B2 * | 8/2002 | Bell | ............ | 324/754.11 |
| 6,462,522 B2 * | 10/2002 | Burstein et al. | ............ | 323/282 |
| 6,713,823 B1 * | 3/2004 | Nickel | ............ | 257/401 |
| 6,727,722 B2 * | 4/2004 | Whetsel | ............ | 324/750.3 |
| 7,557,597 B2 * | 7/2009 | Anderson et al. | ............ | 324/750.3 |
| 7,560,935 B2 * | 7/2009 | Morimoto | ............ | 324/525 |
| 7,665,049 B2 * | 2/2010 | Muranaka | ............ | 716/136 |
| 7,751,993 B2 * | 7/2010 | Mirafzal | ............ | 702/58 |
| 8,040,511 B1 * | 10/2011 | Krishnan et al. | ............ | 356/369 |
| 8,106,516 B1 * | 1/2012 | Lacap et al. | ............ | 257/772 |
| 2001/0035746 A1 * | 11/2001 | Burstein et al. | ............ | 323/283 |
| 2002/0181084 A1 * | 12/2002 | Martinez et al. | ............ | 359/344 |
| 2002/0181085 A1 * | 12/2002 | Martinez et al. | ............ | 359/344 |
| 2002/0181087 A1 * | 12/2002 | Martinez et al. | ............ | 359/344 |

(Continued)

FOREIGN PATENT DOCUMENTS

WO    WO 2008004414 A1 *   1/2008

*Primary Examiner* — Patrick Assouad
*Assistant Examiner* — Lamarr Brown
(74) *Attorney, Agent, or Firm* — Weaver Austin Villeneuve and Sampson LLP

(57) ABSTRACT

A detection circuit and one or more wires or circuit traces are included in a die. The combination is used to detect mechanical failure of the substrate, e.g. silicon after singulation of the dice from the wafer. Failures may be detected at different regions or planes within the die, and the tests may be performed during operation of the packaged die and integrated circuit, even after installation and during operation of a larger electronic device in which it is incorporated. This is especially useful for chip scale packages, but may be utilized in any type of IC package.

35 Claims, 1 Drawing Sheet

U.S. PATENT DOCUMENTS

| | | | |
|---|---|---|---|
| 2003/0047800 A1* | 3/2003 | Sasakura et al. | 257/691 |
| 2004/0017205 A1* | 1/2004 | Sievers et al. | 324/522 |
| 2004/0036466 A1* | 2/2004 | Berkely | 324/158.1 |
| 2005/0045697 A1* | 3/2005 | Lacap et al. | 228/180.22 |
| 2005/0212147 A1* | 9/2005 | Nishizawa | 257/786 |
| 2007/0176604 A1* | 8/2007 | Morimoto | 324/525 |
| 2007/0285843 A1* | 12/2007 | Tran | 360/245.9 |
| 2008/0012572 A1* | 1/2008 | Tsukuda | 324/522 |
| 2009/0174426 A1* | 7/2009 | Matoba et al. | 324/763 |
| 2009/0237382 A1* | 9/2009 | Kunimori | 345/207 |

\* cited by examiner

INTEGRATED ELECTRICAL CIRCUIT AND TEST TO DETERMINE THE INTEGRITY OF A SILICON DIE

BACKGROUND OF THE INVENTION

The present invention relates generally to integrated circuits and more specifically to the testing of integrated circuit packages and the dice used therein.

Integrated circuits are generally made in silicon or other wafers. Some or all of the circuit is typically fabricated while the wafer is intact and then the wafer is diced into individual dice, each of which is then further processed to add electrical connections as part of creating the final integrated circuit package. The semiconductor dice are tested during production before the wafer is sawn or diced and the individual die are singulated.

Damage may occur to the die and the circuits of the die at any stage of the packaging and subsequent device integration after the pre-dicing wafer scale tests.

Numerous package types have evolved over time, the majority of which include some type of encapsulation to protect the die and the electrical connections (bond wires, leads, balls etc.). A more recently developed integrated circuit package referred to as a chip scale package, however, is not encapsulated at all. The die of a chip scale package is especially vulnerable as it is not encapsulated and thus lacks the protection that the encapsulation provides.

SUMMARY OF THE INVENTION

A detection circuit and one or more wire loops or circuit traces serve to detect a short or loss of continuity, indicating a mechanical and/or electrical problem in a die or completed integrated circuit package, which may also be referred to as a "chip."

The circuit can be used to detect a mechanical failure at different locations of the die and at any point in time. For example, it may be used at any stage of manufacturing or assembly, to aid or eliminate the need for optical inspection. It may also be used every time the die is powered up in the application where the die is eventually integrated. The circuit may also be continuously monitored while the chip is powered and able to perform a self check.

If mechanical failure is detected by the circuit, an appropriate response can be taken, such as: do not allow the chip to operate; declare a fault to the system at large via a fault pin; and declare a fault to the system at large via a serial interface.

One aspect relates to an integrity testing device for use in or with an integrated circuit package comprising an integrated circuit die. The testing device comprises one or more wires, at least a portion of one of the wires located at a perimeter of the die. The detection circuit is electrically coupled to first and second points of each of the one or more wires and is configured to monitor the one or more wires and detect a problem with the integrity of the die adjacent at a location of the one or more wires.

Another aspect relates to a method for determining the integrity of an integrated circuit die. The method comprises providing one or more conductive elements adjacent a perimeter of the die; providing a detection circuit electrically coupled to first and second ends of each of the one or more conductive elements; and monitoring the one or more conductive elements with the detection circuit and detecting a problem with the integrity of the die adjacent the perimeter of the die.

A further understanding of the nature and advantages of the present invention may be realized by reference to the remaining portions of the specification and the drawings.

DETAILED DESCRIPTION OF SPECIFIC EMBODIMENTS

Figure 1A:
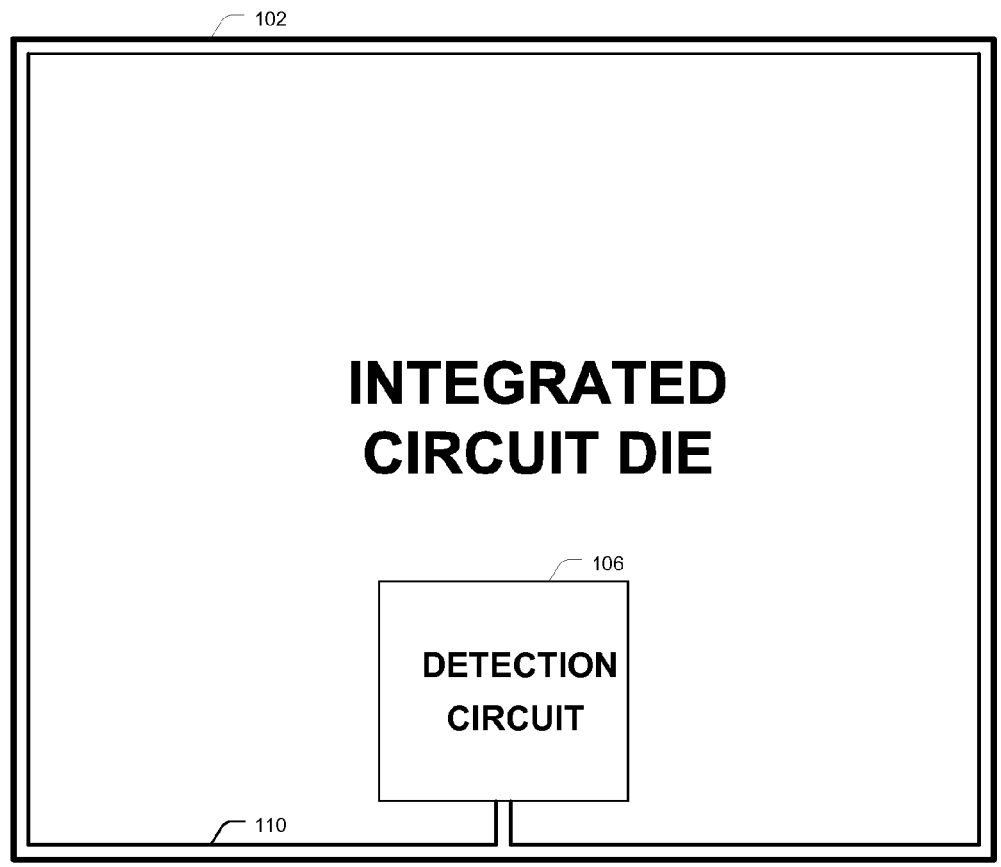
FIG. 1A is a plan view of an integrated circuit die according to an embodiment of the invention.

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

Semiconductor die are traditionally encapsulated in a package of a mechanically robust material such as plastic or ceramic.

These packages serve, among many, two primary functions. They provide electrical connectivity from the IC circuits embedded in the die to a printed circuit board ("PCB") or other means of interacting with the larger system (via bond wires, ball grid arrays, mechanical leads etc). They also provide mechanical protection to the fragile die medium (e.g. silicon or germanium etc.) from damage during manufacturing, handling, assembly, test, and in the field.

With the advent of the chip scale package ("CSP") the traditional encapsulation of the package is eliminated and the silicon die itself is directly attached to the PCB through CSP solder balls that create an electrical and mechanical connection directly from the die to the PCB.

One of the major benefits of the CSP package is its low cost since there is no physical encapsulating package or manufacturing process needed to place the die in the package. There are several downsides of the lack of encapsulation in a CSP package.

The silicon medium is more mechanically fragile and exposed to damage during both the manufacturer's handling and mounting as well as in the real world during end-use life in the field.

With problematic manufacturing processes and/or end user accessibility, the CSP package has been shown to be somewhat susceptible to damage as described above. Damage may include cracks, chips, etc, any of which may result in a defective circuit or chip.

One common practice employed to limit defective units is to optically inspect the die at the very end of the manufacturing and assembly process. However, this is not possible once the die is packaged in many package types, and it is also not possible or practical once the die is integrated into an electronic device.

Embodiments of the invention comprise an electrical circuit that detects whether the mechanical and electrical integrity of the outer perimeter of the silicon die has been compromised or is sufficiently intact.

In the embodiment shown in FIG. 1A, a loop wire 110 is fabricated on or in the die 102 at the perimeter of the die and the continuity of the wire is electrically checked to ensure it is intact with detection circuit 106. Damage of the wire 110 that results in a lack of continuity is an indicator that the integrity of die 102 has been compromised.

It should be noted that wire 110 may have any geometrical shape and need not be strictly located at or near the perimeter of die 102. While element 110 will be referred to as a wire, it should be understood that it may be implemented as any type of conductive path such as a trace or circuit formed from a metal or other conductive layer using conventional integrated circuit fabrication techniques. More complex implementations of wire 110 and detection circuit 106 determine if the wire 110 is shorted to any supply voltage by first connecting (via logic and switching) one end to ground and checking that the other end is also at ground. After this step wire 110 can then be connected to the supply and similarly the other end is checked for connectivity to the same supply. This is helpful since the outer perimeter of the die is normally surrounded by other metal connectivity, normally connected to one supply voltage or another. Note that although connection at an end of the wire is discussed, connection may be made at any different points on the wire.

Similarly, if any particular IC die implementation has supply voltages near the outer perimeter of the die, detection circuit 106 will check to see that the wire 110 is not shorted to those supply voltages in addition to or as an alternative to the tests described above.

Figure 1B:
FIG. 1B is a cross section of an integrated circuit die according to an embodiment of the invention.

In some embodiments, multiple wires or wire loops, e.g. 110B and 110C as shown in the cross section of FIG. 1B, are placed adjacent to each other and detection circuit 106 will check that the wires do not make electrical contact, or in other words do not become shorted to each other. Each wire forms a loop, with each end of the wire coupled to detection circuit 106. Detection circuit 106 may therefore be said to have a transmitter, and a receiver, where a signal is sent from and received at the circuit, respectively. Any electrical characteristic of the signal may be monitored/detected/measured. For example, the detection circuit may sense and measure a voltage level or current level at the receiver. The receiver may also measure a combination of voltages of more than one wire and combine them logically. The signal and an electrical characteristic of the signal may be modulated over time. For example, $V_{dd}$ may be connected at time one, and a different voltage such as ground may be connected at time two, and then switched back and forth. A third and fourth signal or level etc. may be added or combined and switched in at different time. The different signals may be sent over the same wire or different wires.

The wires may be located in the same plane, e.g. 110B and 110C, or may be located within different planes above or below another wire, e.g. 110A and 110B or 110D. In such a case the circuit can determine the severity of a problem, and not simply if there is a problem. For example, if a first wire loses continuity, (i.e. has an open leg) but another wire does not, this may indicate the location or severity of a mechanical defect or breach of integrity. Similarly a short between two wires may also localize a mechanical defect.

In certain embodiments wire 110 may share functionality with other pre-existing structures such as the seal ring around the perimeter of the chip.

In certain embodiments where multiple sets of detection wires are employed, each set may be in only a certain portion of the die. For example each quadrant of the die might have one or more sets of detection wires, as described above. Thus, the location and severity of the problem may be localized. For example a problem might be detected within one quadrant of the die, and the problem may only exist at one plane but not another plane, or at an outer perimeter but not at a more central perimeter. In such a case, the defect while noted, may not be severe enough to merit discontinued use of the die or the larger system or sub-system of which it is a part. Detection of such a defect may be used to indicate a potential future problem and/or to initiate refinements in the manufacturing or assembly processes.

The circuit 106 can be used to detect a mechanical failure at any point in time. For example, it may be used at any stage of manufacturing/assembly, to aid or eliminate the need for optical inspection. It may also be used every time the die is powered up in the application where the die is eventually integrated. The circuit may also be continuously monitored while the chip is powered and able to perform the self check.

If mechanical failure is detected by the circuit an appropriate response can be taken such as: prevent chip operation; declare a fault to the system at large via a fault pin; and declare a fault to the system at large via a serial interface.

While the invention has been particularly shown and described with reference to specific embodiments thereof, it will be understood by those skilled in the art that changes in the form and details of the disclosed embodiments may be made without departing from the spirit or scope of the invention. For example, although the disclosed embodiments are described in terms of the benefit to CSP packages, the invention may be utilized in conventional package technologies as an additional check to ensure undetectable damage was not incurred during the package assembly process.

In addition, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A method for determining the integrity of an integrated circuit die, the method comprising:
providing one or more conductive elements adjacent a perimeter of the die;
providing a detection circuit electrically coupled to first and second ends of each of the one or more conductive elements; and
monitoring the one or more conductive elements with the detection circuit during normal operation of a primary circuit of the die to detect a problem with the integrity of the die adjacent the perimeter of the die.

2. The method of claim 1, wherein monitoring the one or more conductive elements with the detection circuit comprises sensing a short between a first and second of the conductive elements.

3. The method of claim 1, wherein monitoring the one or more conductive elements with the detection circuit comprises sensing a short between a conductive element and a supply voltage.

4. The method of claim 1, wherein monitoring the one or more conductive elements with the detection circuit comprises sensing an open leg of the conductive element.

5. The method of claim 1, further comprising preventing an integrated circuit formed in the die from operating.

6. The method of claim 1, further comprising preventing a device incorporating the die from operating.

7. The method of claim 1, further comprising providing an indication of a potential failure of the die or an integrated circuit of the die.

8. The method of claim 1, wherein the monitoring is performed at each start up of the primary circuit of the die or a device incorporating the die.

9. The method of claim 1, wherein the monitoring is performed periodically during operation of the primary circuit of the die or a device incorporating the die.

10. The method of claim 1, wherein the monitoring is performed continuously during operation of the primary circuit of the die or a device incorporating the die.

11. The method of claim 1, wherein monitoring the one or more conductive elements with the detection circuit comprises localizing an area of compromised integrity within the die.

12. The method of claim 1, wherein monitoring the one or more conductive elements with the detection circuit comprises sensing a voltage at a receiver of the detection circuit.

13. The method of claim 1, wherein monitoring the one or more conductive elements with the detection circuit comprises sensing a current at a receiver of the detection circuit.

14. The method of claim 1, wherein monitoring the one or more conductive elements with the detection circuit comprises measuring a combination of voltages of more than one wire and logically combining the voltages.

15. The method of claim 1, wherein the detection circuit transmits a signal with an electrical characteristic that is modulated between a first value at a first period in time and at least a second value at a second period in time.

16. An integrity testing device for use with an integrated circuit package comprising an integrated circuit die, the integrity testing device comprising:
    one or more wires, at least a portion of one of the wires located at a perimeter of the die; and
    a detection circuit electrically coupled to first and second points of each of the one or more wires,
    the detection circuit configured to monitor the one or more wires during normal operation of a primary circuit of the die and detect a problem with the integrity of the die adjacent a location of the one or more wires.

17. The integrity testing device of claim 16, wherein the detection circuit is configured to sense a short between a first and second of the wires.

18. The integrity testing device of claim 16, wherein the detection circuit is configured to sense a short between one or more of the wires and a supply voltage conductor.

19. The integrity testing device of claim 16, wherein the detection circuit is configured to sense an open leg of one or more of the wires.

20. The integrity testing device of claim 16, wherein the detection circuit is configured to prevent an integrated circuit formed in the die from operating.

21. The integrity testing device of claim 16, wherein the detection circuit is configured to prevent a system incorporating the die from operating.

22. The integrity testing device of claim 16, wherein the detection circuit is configured to provide an indication of a potential failure of the die or an integrated circuit of the die.

23. The integrity testing device of claim 16, wherein the detection circuit is configured to detect a problem at each start up of the primary circuit of the die or a system incorporating the die.

24. The integrity testing device of claim 16, wherein the detection circuit is configured to continuously monitor the integrity during operation of the integrated circuit package or a system incorporating the package.

25. The integrity testing device of claim 16, wherein the detection circuit is configured to localize an area of compromised integrity within the die.

26. The integrity testing device of claim 16, wherein the detection circuit is configured to sense a voltage at a receiver of the detection circuit.

27. The integrity testing device of claim 16, wherein the detection circuit is configured to sense a current at a receiver of the detection circuit.

28. The integrity testing device of claim 16, wherein the detection circuit is configured to measure a combination of voltages of more than one wire and logically combine the voltages.

29. The integrity testing device of claim 16, wherein the detection circuit is configured to modulate a detection signal between a first value at a first period in time and at least a second value at a second period in time.

30. The integrity testing device of claim 16, wherein the one or more wires comprises a plurality of wires, each of the plurality of wires being configured for fault detection with the corresponding detection circuit.

31. The integrity testing device of claim 30, wherein the plurality of wires are located in a plurality of planes substantially parallel with a primary orientation of the integrated circuit die.

32. The integrity testing device of claim 30, wherein two of the plurality of wires are located adjacent each other in a plane substantially parallel with a primary orientation of the integrated circuit die.

33. The method of claim 1, wherein the one or more conductive elements comprises a plurality of conductive elements, each of the plurality of conductive elements being configured for fault detection with the corresponding detection circuit.

34. The method of claim 33, wherein the plurality of conductive elements are located in a plurality of planes substantially parallel with a primary orientation of the integrated circuit die.

35. The method of claim 33, wherein two of the plurality of conductive elements are located adjacent each other in a plane substantially parallel with a primary orientation of the integrated circuit die.

* * * * *